United States Patent [19]

Fayfield

[11] Patent Number: 5,198,664
[45] Date of Patent: Mar. 30, 1993

[54] PHOTOELECTRIC SENSOR ASSEMBLY HAVING COMPRESSIBLE AND SEALING MEMBERS

[75] Inventor: Robert W. Fayfield, Shorewood, Minn.

[73] Assignee: Banner Engineering Corporation, Minneapolis, Minn.

[21] Appl. No.: 731,985

[22] Filed: Jul. 18, 1991

[51] Int. Cl.⁵ .............................................. H01J 5/02
[52] U.S. Cl. .................................................. 250/239
[58] Field of Search ................ 250/239, 573, 554, 551

[56] References Cited

U.S. PATENT DOCUMENTS

| | | | |
|---|---|---|---|
| 4,118,105 | 10/1978 | Voigt | 250/227.24 |
| 4,207,464 | 6/1980 | Fukuyama et al. | 250/239 |
| 4,515,336 | 5/1985 | Fischer | 248/288.3 |
| 4,547,673 | 10/1985 | Larsen et al. | 250/239 |
| 4,717,882 | 1/1988 | Billings et al. | 324/415 |
| 4,792,685 | 12/1988 | Yamakawa | 250/353 |
| 4,873,469 | 10/1989 | Young et al. | 315/155 |

OTHER PUBLICATIONS

Bill McIlvaine, Sensors Meet More Demanding Applications, Managing Automation, Aug. 1991, pp. 14–15.

*Primary Examiner*—David C. Nelms
*Assistant Examiner*—T. Davenport
*Attorney, Agent, or Firm*—Merchant, Gould, Smith, Edell, Welter & Schmidt

[57] ABSTRACT

An improved photoelectric sensor assembly has a one-piece threaded barrel housing, preferably with focus lenses formed therein. An aperture piece fits within the barrel housing, and a printed circuit board carrying the scanner electronics fits in behind it with the optoelectronic elements aligned with the aperture piece and the lenses. A power and signal cable from the circuit board extends out the back end of the sensor housing. A foam compression ring fits against the PC board and is backed by a washer, second compression ring and second washer, all of which have apertures for the cable to pass through. An end cap threads onto the rear of the threaded barrel and compresses the washers and compression rings. The foam ring gently holds the circuit board and aperture piece in place, and the second compression ring, which is preferably formed of a stiffer closed-cell material, is resiliently compressed against the inside of the entire barrel housing and long the cable to provide a reliable shock- and thermal-resistant moistureproof seal, eliminating the need for epoxy potting and close tolerance internal seals to protect the optical components from the epoxy. The end cap is preferably formed with a spherical outer surface, which may be received in a mounting bracket having a spherically sectioned aperture to permit two degrees of freedom in aligning the sensor for use in applications.

15 Claims, 6 Drawing Sheets

PHOTOELECTRIC SENSOR ASSEMBLY HAVING COMPRESSIBLE AND SEALING MEMBERS

FIELD OF THE INVENTION

This invention pertains generally to the field of photoelectric sensors, and more particularly to an improved construction for a photoelectric sensor assembly which is simple and inexpensive to manufacture, and which provides a rugged and reliable sensor suitable for use in a wide variety of environments and applications.

BACKGROUND OF THE PRIOR ART

Photoelectric sensors, sometimes referred to as scanners, are widely used in the fields of electrical and electronic controls in a wide variety of industrial applications. Some sensors are designed as two-part systems, wherein the light transmitting unit and light receiving unit are in separate housings which may be placed remote from each other to define an optical path for sensing the presence or absence of objects. In single-unit sensors, the light transmitter and receiver are combined in a single housing intended to be used with a retroreflector or a reflective object that is positioned apart from the scanner to define the optical sensing path. The present invention is applicable either to two-part or single-unit scanners; and the preferred form, for purposes of economy, is a single-unit scanner. It is advantageous to provide a scanner construction that is low in cost, flexible in mounting techniques for use in a variety of applications, and rugged enough to withstand environmental factors to which it may be subjected in use. To these ends, a common type of sensor package has been provided in the prior art, known as a threaded barrel sensor. This type of package consists of a cylinder, typically 8, 12, 18 or 30 millimeters in diameter, and threaded over its entire length. Optical output/input is provided at one end via a suitable lens or lenses, and typically an electrical connection in the form of a cable is provided at the other end. Often an indicator LED is provided at the cable end of the barrel to show the ON/OFF status of the sensor output. The threaded length provides a convenient mounting mechanism using a pair of jam nuts to secure it in a simple mounting bracket.

Photoelectric sensors generally have one or two lenses, or a double lens, to collimate and focus the emitted and received light. Typically in prior art barrel sensors, the lenses are made of clear plastic or of glass, and are fastened inside the barrel housing using an intermediate lens holder mechanism, usually a molded plastic part.

Also inside the barrel there is usually a printed circuit board which contains the sensor electronics and the optoelectronic elements, which usually consist of an LED emitter and a phototransistor or photodiode receiver.

In such prior art barrel sensors, the usual manufacturing technique is to assemble the printed circuit board, install the lenses in the intermediate lens holder, install the lens holder in the barrel (often using an "O"-ring for sealing), install the indicator LED and cable in the rear end cap, install the printed circuit board in the barrel, install the rear end cap on the barrel, then encapsulate the entire assembly with epoxy. The epoxy encapsulation is used for environmental sealing primarily against moisture, but also against other contaminants or gases to which the unit might be exposed in use. In such prior art systems, the encapsulation step requires that all parts fit together and seal perfectly, or else the epoxy will leak into the optical chamber, and may also leak out of the barrel housing. It is therefore necessary to provide leakproof joints around the lenses, the lens holder and the optoelectronic elements to keep epoxy from leaking into them, and around the rear end cap, the indicator LED, and the cable entrance, to prevent epoxy from leaking out. A high degree of dimensional precision in the various parts is required to achieve this sealing. This is an expensive and time-consuming process, but a necessary one in the prior art.

In prior art barrel sensors, even the encapsulation process does not guarantee integrity against environmental influences, because such sensors can be vulnerable to moisture despite the encapsulation. Liquids can enter at epoxy-to-plastic boundaries by capillary action. A common entrance point for moisture is around the indicator LED. Constant thermal cycling of the sensor can cause slight gaps to open. Moisture is then drawn along the boundary over an extended period of time, which could take months, until it reaches a part of the circuit where it lowers the impedance and renders the sensor inoperative or faulty. This capillary action can also take place at each end of the barrel, at the lens boundaries, and at the cable entrance.

SUMMARY OF THE INVENTION

The present invention provides an improved sensor assembly which is very simple and quick to assemble, uses a minimum of parts, eliminates need for tight tolerances for dimensions of the parts, and eliminates the need for epoxy encapsulation and its attendant problems.

According to the invention there is provided a single-piece threaded barrel housing, into which the lens optics, circuit board and all other necessary parts are assembled, and all are held in place by a screwed on or pressed in rear end cap. This includes an elastomeric interface that is pressed into position to seal the cable entrance and rear end cap. The elastomeric interface is reliable as a moisture barrier and as a strain relief over large extremes of temperature, shock vibration and manufacturing tolerances.

Additionally, the rear cap mounting means can perform a dual function of cooperating with an improved mounting bracket to provide adjustment of the sensor's optical path in two dimensions. This is accomplished in the preferred embodiment by providing a rounded exterior surface portion on the rear end cap, which is received in a mounting bracket having a corresponding contoured holding section.

DETAILED DESCRIPTION OF THE PREFERRED EMBODIMENT

Figure 1:
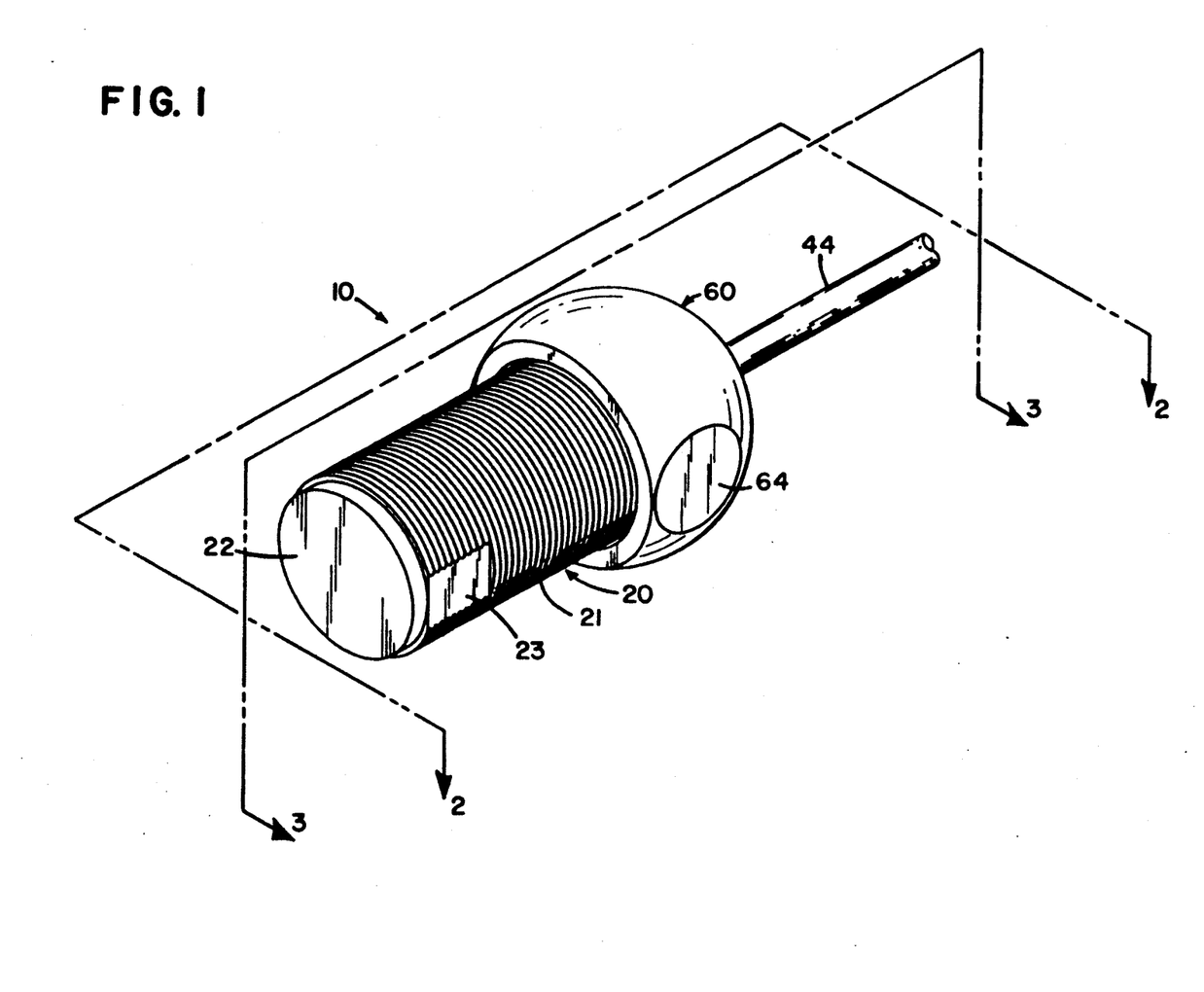
FIG. 1 is an isometric view of a threaded barrel sensor assembly according to the present invention.
Figure 2:
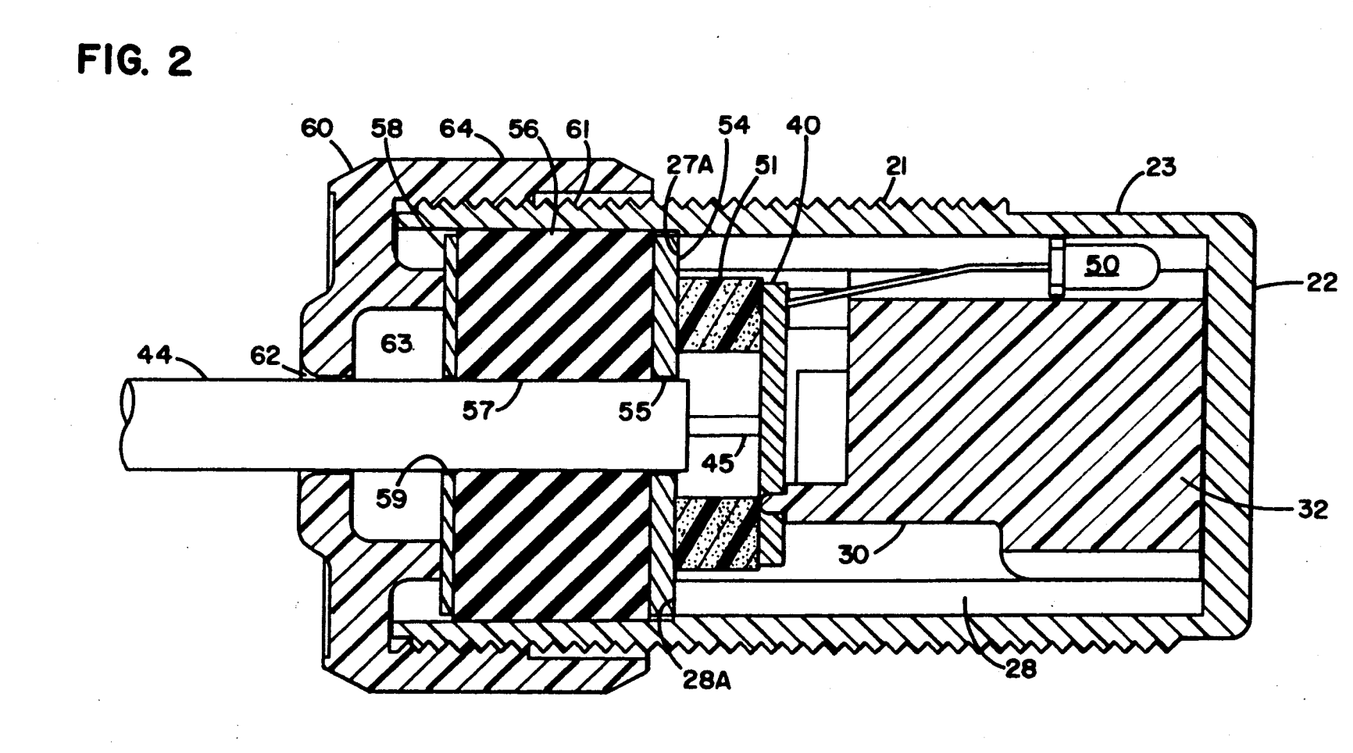
FIG. 2 is a transverse sectional view, at an enlarged scale, of the sensor assembly of FIG. 1, taken generally along line 2—2 of FIG. 1.

In FIG. 1, the overall barrel sensor 10 includes a barrel housing 20 having threading 21 over all or substantially all of its exterior surface. In the preferred embodiment, the threading is M30X1.5 standard thread. An end cap 60 is threaded onto the rear end of the housing. Front surface 22 is at the front or sensing end, as the optoelectronic elements are positioned internally of the sensor, behind front surface 22. A thin wall section 23 is provided so that an indicator LED can be seen through it as an aid in alignment, as explained further below. Housing 20 is a single molding of a plastic material that is both rugged and at the same time transparent to the infrared wave lengths of light used in most photoelectric sensors, about 900 nanometers. It should also pass enough light at about 650 nanometers so that the indicator LED 50 will be visible through it. A clear plastic would work, but a dark red material having a cutoff below about 580 nanometers will provide better immunity to the modulation of fluorescent lights. There are many available materials for such housing, including acrylic, polystyrene and polysulfone.

Figure 3:
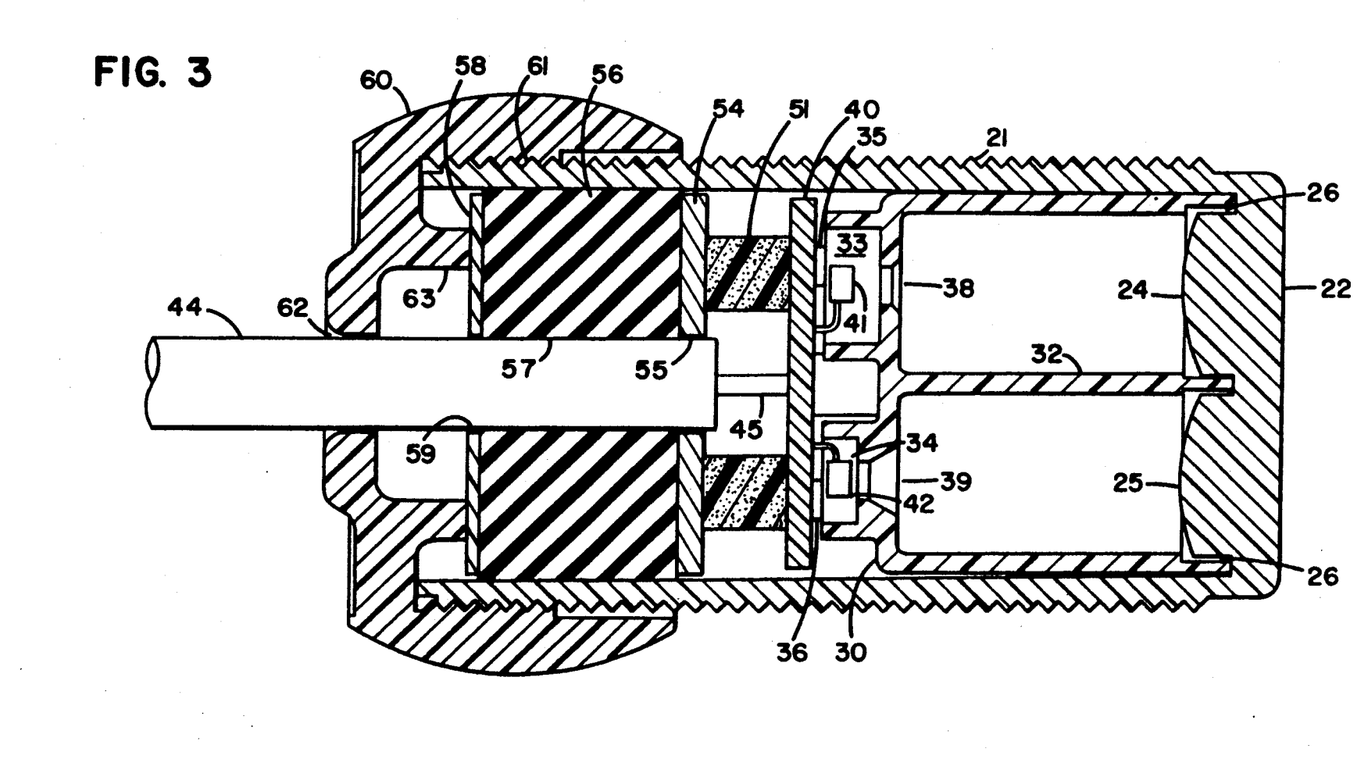
FIG. 3 is a longitudinal sectional view, at an enlarged scale, of the sensor assembly of FIG. 1, taken generally along line 3—3 of FIG. 1.
Figure 4:
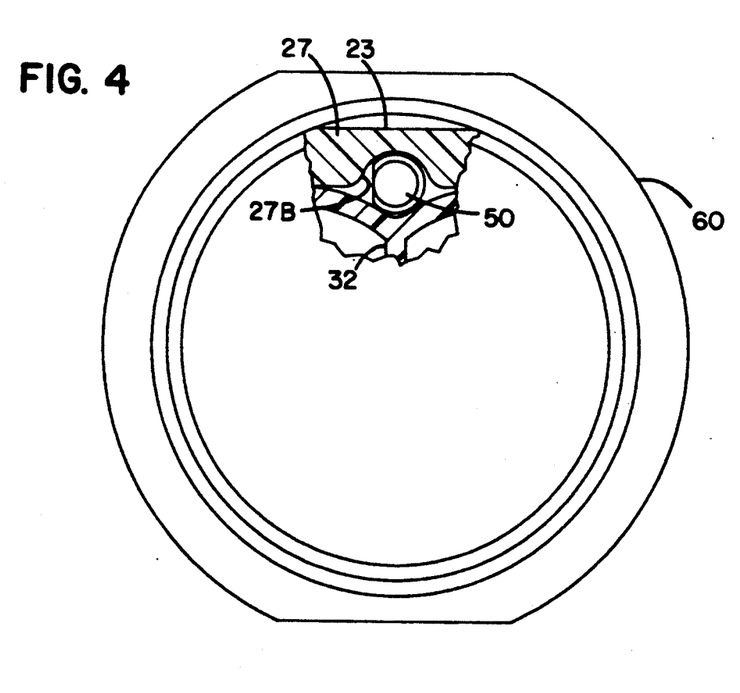
FIG. 4 is an end view, at an enlarged scale, of the sensor assembly of FIG. 1, portions thereof broken away for illustrating internal detail.

The inside of housing 20 is substantially a cylindrical hollow to receive the other components of the assembly. The collimating lenses are ideally molded into the front section 22, either internally (as shown in FIG. 3, the preferred embodiment), or externally, or a combination of both. In the preferred embodiment, both the phototransmitter and photoreceiver are in the same housing, so a pair of lenses 24, 25 are provided. Recesses 26 are formed between the lenses 24, 25, and between each of them and the outer wall of the housing 20. A pair of longitudinal ridges 27, 28 are formed integrally with the inside of housing 20; at their rearward ends, they form ledge portions 27a, 28a, used as abutment members during assembly, as explained below. As can be seen in FIG. 4, ridge member 27 is grooved with a longitudinal groove 27b to receive and help to locate the indicator LED 50.

An opaque aperture piece 30 is designed to fit inside barrel housing 20. It has apertures 38, 39 aligned with lenses 24, 25 for the emitted and received infrared light. It is molded of opaque material, and has a mid-divider portion 32 to prevent "crosstalk" light from the emitter from reaching the receiver other than through the desired path along the sensing optical path of the device. Outer walls 31 of the aperture piece fit into recesses 26, and the mid-divider wall 32 fits into the middle recess 26. Preferably, the outer shape of the aperture piece is designed in conjunction with ridges 27, 28 to "key" the aperture piece so that it can only be slid into the interior of housing 20 in a preferred orientation which will align the internal components appropriately.

At the rearward end of aperture piece 30 are formed well portions 33, 34. Printed circuit board 40 is designed to be positioned adjacent the rearward end of aperture piece 30, abutting against three legs, two of which are seen in FIG. 3 at reference numbers 35, 36. These legs have small protruding knobs on their ends (not shown) which fit into holes provided at matching locations on the PC board 40, so that the PC board may be press fit onto the aperture piece during assembly. The optoelectronic elements, comprising phototransistor 41 and LED 42, are soldered to PC board 40, and positioned such that when PC board 40 is positioned behind aperture piece 30, the optoelectronic elements 41, 42, will be in their respective well areas 33, 34, aligned with apertures 38, 39 and lenses 24, 25, respectively. The circuitry for operating the optoelectronic elements 41, 42 and providing switching output signals are generally known in the art, and are therefore not described in detail here. An indicator LED 50 connects through its leads from PC board 40 and is positioned alongside aperture piece 30 adjacent thin wall section 23. This LED operates when reflected signal is being received by the scanner, and can be seen by installation personnel through the thin wall section 23 of the housing, as well as through the front section 22, and is useful when aligning the sensor and/or retroreflector (not shown) on initial setup.

Cable 44 provides power and output signals, as is generally known in the art, to and from the sensing circuitry on PC board 40. Cable 44 is preferably jacketed, for example, with PVC, and includes a plurality of wires as is generally known, one of which, indicated by reference number 45, is seen soldered to the PC board 40.

Circuit board 50 and aperture piece 30 are held in place inside the housing 20 by a first compressible ring 51, a first washer 54, a second compressible ring 56, and a second washer 58, and end cap 60.

First compressible annular ring 51 is preferably made of a foam rubber material so that it may gently hold the printed circuit board 40 against the aperture piece 30 and the aperture piece in turn against the inside of the front of the housing. First washer 54 has a diameter to fit within the interior of housing 20, and to seat against the ledge portions 27a, 28a while compressing compressible ring 51. Washer 54 is preferably made of a stiff material such as metal or plastic. It has a central aperture 55 for the cable 44 to pass through.

Second compressible annular ring 56 has a diameter to fit within the interior of housing 20 where it is held between washers 54 and 58. It has a central aperture 57 for the cable 44 to pass through. Compressible ring 56 is much harder to compress than ring 51. It is preferably of closed-cell construction, such as neoprene.

Second washer 58 is sized to substantially fill the interior diameter of housing 20, and has a central aperture 57 to receive cable 44. Washer 58 is positioned at the back of second compressible ring 56. It is also made of a stiff material such as plastic or metal, and serves to apply the compression force from the end cap 60 to compressible members 56. Note, however, that washer 58 would not be required if end cap 60 were otherwise secured to the sensor housing, as by press-fit or ultrasonic welding or the like. However, in the preferred embodiment, a screw-on end cap 60 and washer 58 are provided.

End cap 60 includes internal threading 61 to match the threading 21 on the outside of the barrel housing 20 and it has a clearance aperture 62 for cable 44, and it has a means for applying force to washer 58, which in the preferred embodiment takes the form of an annular ring portion 63. Cap 60 also includes flat sections 64 as an aid in tightening. When cap 60 is threaded down, washer 54 is moved against ledges 27, 28a, compressing ring 51 which secures PC board 40 and aperture piece 30 in position. Tightening of cap 60 also applies force to the second compressible member 56, via washer 58. When compressed, it deforms in such a way that it seals tightly against the inner walls of the barrel housing 20, and also along the cable jacket. This sealing provides a reliable waterproof elastomeric seal for the sensor. If the material of ring 56 is hard enough, it also provides a strain relief for cable 44, such that the cable will not easily be pulled from the housing during use or assembly.

The elastomeric compression ring 56 provides a reliable moisture seal, both along the cable 44 and along the inside of the housing. Unlike the case of epoxy seals of the prior art mentioned above, this elastomeric seal will not form gaps or openings due to shock, strain or thermal cycling.

The assembly is extremely easy and simple to manufacture and assemble. The PC board is preferably assembled by robotics as is generally known in the electronic art. The PC board is pushed onto the posts 35, 36. This places the optoelectronic elements in their appropriate wells. in the aperture piece 30. The end cap, two compression rings and two washers are threaded onto the cable 44 in proper order. The wires 45 of cable 44 are soldered to the PC board. The aperture piece 30, with PC board and cable, is then placed inside barrel housing 20. The ridges 27, 28 help key the aperture piece 30 to the proper orientation. First compression ring 51, washer 54, second compression ring 56, and second washer 58 are then pushed into place inside housing 20 along cable 44. End cap 60 is threaded onto the rear end of barrel housing 20 and tightened to compress the compression rings as mentioned above. The entire operation takes place with a minimum amount of part handling. Also, since there is no epoxy encapsulation, there is no need for close tolerance epoxy seals around the lenses or optoelectronic elements. In general, compared to the prior art, the parts of this improved sensor assembly can be of lower tolerance, and lower cost. This is because of the elimination of epoxy seals, and because the compression of the elastomeric seal can accommodate a certain range of dimensional variation.

While the improved sensor assembly of the present invention can be mounted in use applications in the same manner as conventional threaded barrel assemblies, according to one aspect of the invention, an improved mounting is provided. As previously mentioned, end cap 60 preferably has a spherical outer surface which can be used as a portion of a pivot for alignment purposes.

Figure 5:
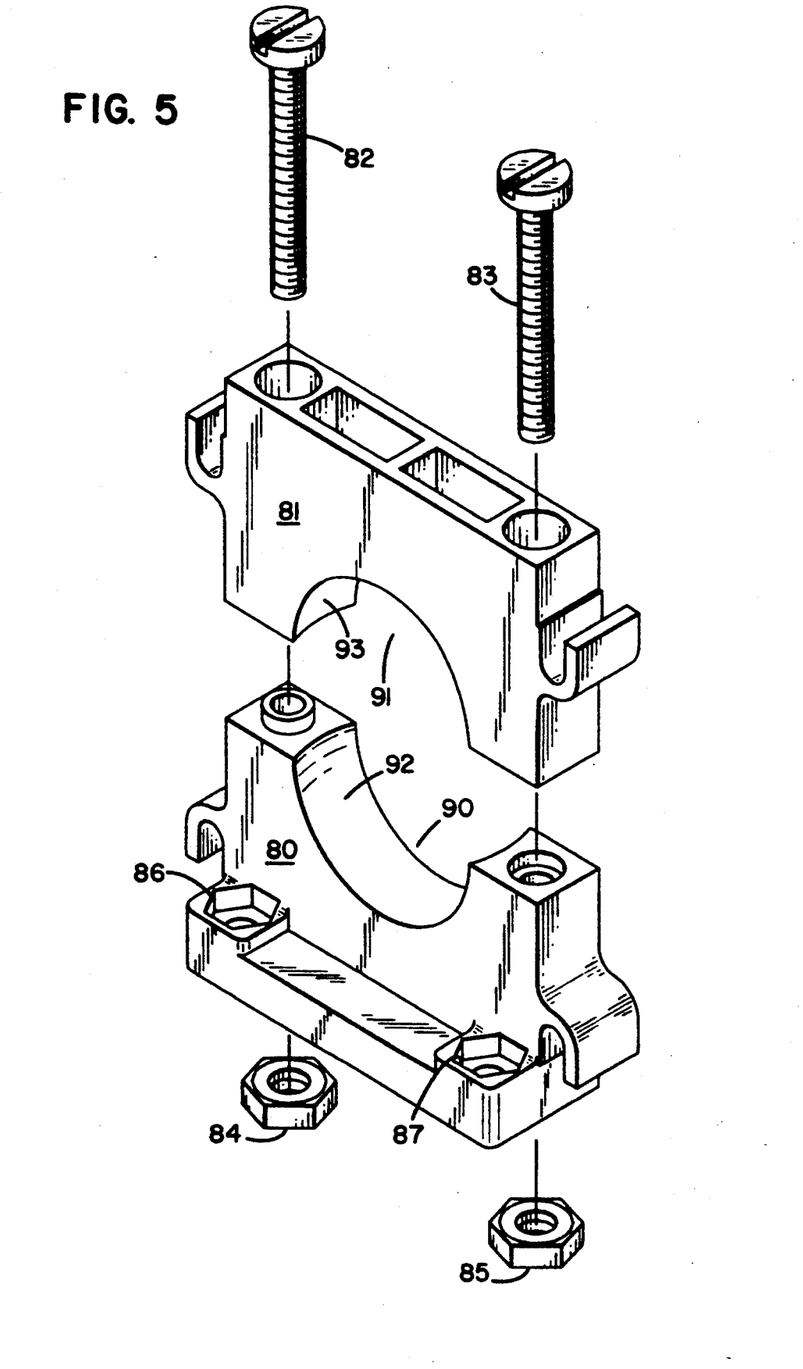
FIG. 5 is an exploded perspective view of a mounting bracket for holding the threaded barrel sensor assembly of FIG. 1.

A mounting bracket as shown in FIG. 5 includes a base portion 80 and a top portion 81. The two are adapted to fit together via mounting bolts 82, 83 which pass through apertures provided in both halves of the brackets and mate with captive nuts 84, 85. Suitable mounting holes 86, 87 are provided in the base portion 80 for attaching the mounting bracket to a work area where the scanner will be used.

Base portion 80 and top portion 81 both have central half-arc apertures formed therein, indicated by reference numbers 90, 91 respectively, such that when the two portions 80, 81 are attached together, a circular aperture is formed. The inner surface 92 of arc 90 and the inner surface 93 of arc 91 are curved as in a spherical section to match the outside curvature of end cap 60.

Figure 6:
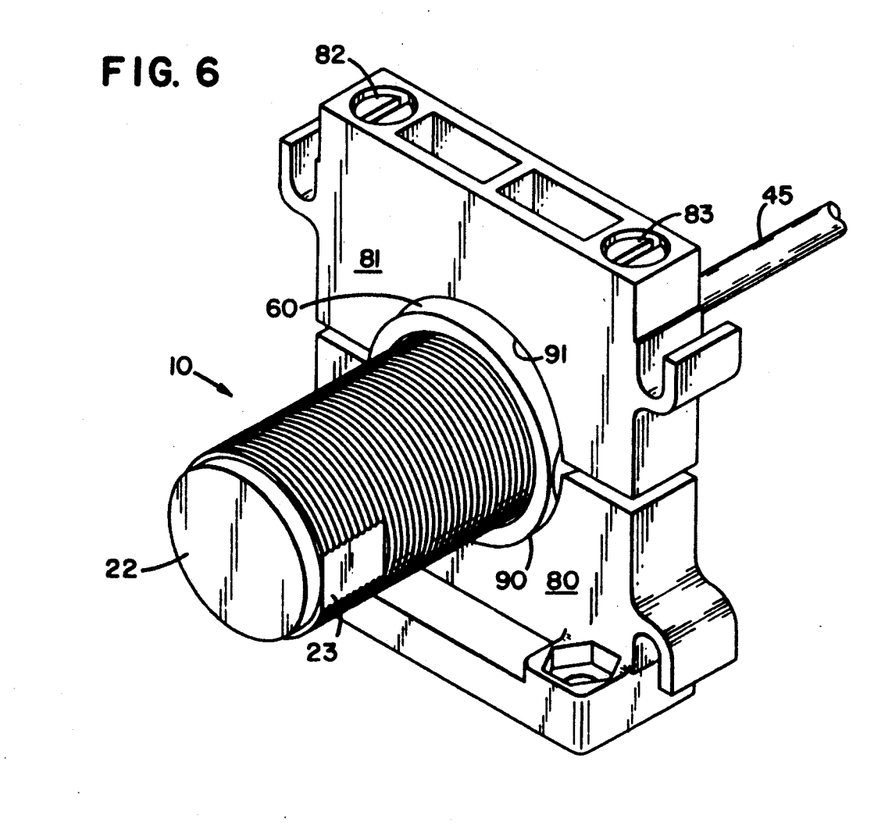
FIG. 6 is a perspective view of the threaded barrel sensor assembled in the bracket of FIG. 5.

In use, the assembled scanner 10 is positioned in the mounting bracket with end cap 60 in the aperture formed by arcs 90, 91, and the screws 82, 93 are loosely tightened down, so that the sensing angle can be pivoted through two dimensions by physically moving the ball and socket formed by the sensor end cap and housing. When proper alignment is achieved, as may be visually determined by looking at LED 50, screws 82 and 83 are secured down to hold the bracket in position. In this fashion, end cap 60 provides the dual functions of securing the scanner assembly and the seals therein while providing a two-axis ball and socket mounting.

What is claimed is:

1. An assembly for a photoelectric sensor, comprising:
   a molded housing member, having a focus lens formed in a forward end thereof, and having internal spaced and an open rearward end for receiving other components of the assembly;
   a circuit module including sensor circuitry and an optoelectronic element, and a cable for external connection for the sensor;
   means for mounting said circuit module within said housing with said optoelectronic element positioned with respect to said lens for defining an optical sensing path from the front of the sensor, and said cable extending from the rear of said housing;
   a resilient sealing member for positioning within said housing and substantially in contact with the interior wall of said housing and said cable;
   a compressible member positioned between said circuit module and said resilient sealing member;
   a force transmission member in contact with said resilient sealing member; and,
   an end cap and means for attaching it to said housing, said end cap including means for pressing on said force transmission member so that said resilient sealing member is compressed and forced into sealing contact with the interior surface of said housing and said cable, to thereby provide a moistureproof seal for the interior of said sensor assembly.

2. An assembly according to claim 1 wherein said means for mounting said circuit module includes an aperture piece fitting within the internal space of said housing and means for positioning said circuit module adjacent said aperture piece, said aperture piece having an aperture or opening for the optical path between said optoelectronic member and said lens.

3. An assembly according to claim 2 wherein said circuit module includes a pair of optoelectronic elements, one for transmitting and one for receiving, wherein said aperture piece has apertures or openings for the optical paths from both of said optoelectronic elements, and wherein the focus lens formed in said housing member is adapted to focus optical sensing paths from the front of the sensor to both of said optoelectronic elements.

4. An assembly according to claim 2 wherein said means for attaching said circuit module to said aperture piece includes resilient means positioned in assembly for urging said circuit module into contact with said aperture piece.

5. An assembly according to claim 1 wherein said molded housing member has threading and said end cap has corresponding threading whereby the end cap is threaded onto and secured to said housing.

6. An assembly according to claim 1 wherein said end cap has a curved or spherical external section, and further including mounting means for adjustably positioning said sensor in use, said mounting means including a socket portion having a curved surface for receiving said curved surface of said end cap, thereby to hold said sensor in position while permitting two degree motion thereof for alignment purposes.

7. An assembly for a photoelectric sensor, comprising:
- an elongate molded housing member, having a focus lens formed in a forward end thereof, having an internal space and an open rearward end for receiving other components of the assembly;
- an aperture piece adapted to fit within said housing;
- a circuit board having sensor circuitry and having an optoelectronic element mounted thereon, and having a cable for external connection for the sensor, said circuit board adapted for mounting adjacent the rearward end of said aperture piece to define an optical sensing path from said optoelectronic element through an opening in said aperture piece, and through said lens to an external sensing path from the front of the sensor;
- a first resilient member positioned adjacent the back of said circuit board for urging it in contact with said aperture piece;
- a first plate positioned within said housing member in contact with said first resilient member;
- a second resilient member comprising a sealing member for positioning within said housing and substantially in contact with the interior wall of said housing and in contact with said first plate, said cable passing therethrough;
- a second plate positioned in said housing in contact with said resilient sealing member, whereby said resilient sealing member is sandwiched between said first and second plates;
- an end cap and means for attaching it to said housing, and including means for pressing on said second plate so that said second resilient member is compressed and forced into sealing contact with the interior surface of the housing and said cable, to thereby provide a moistureproof seal for the interior of the sensor assembly.

8. An assembly according to claim 7 wherein said circuit board has optoelectronic transmitting and receiving elements mounted thereon, wherein said aperture piece has openings aligned with both of said optoelectronic elements, and an opaque baffle therebetween to prevent unwanted scattering of light from the transmitting element to the receiving element, and wherein said focus lens of said housing member is adapted to focus external sensing paths from the front of the sensor to both the transmitting and receiving optoelectronic elements.

9. An assembly according to claim 7 wherein said internal space of said housing is substantially cylindrical, and wherein said first and second plates and resilient sealing member are cylindrical annular members, with said cable passing through apertures formed therein.

10. An assembly according to claim 7 wherein said housing has an abutment member formed therein to receive said first plate, so that not all the force applied by said end cap will be transmitted to said first resilient member.

11. An assembly according to claim 7 wherein said housing has external threading over at least a portion of its external surface, and wherein said end cap has threading for engaging the threading of said housing, so that said end cap can be threaded onto the housing to thereby compress said resilient sealing member.

12. An assembly according to claim 7 wherein said end cap has a curved or spherical external section, and further including mounting means for adjustably positioning said sensor in use, said mounting means including a socket portion having a curved surface for receiving the curved surface of said end cap, to thereby hold said sensor in position while permitting two degree motion thereof for alignment purposes.

13. An assembly for a photoelectric sensor, comprising:
- an elongate substantially cylindrical molded housing member, having a focus lens formed in a forward end thereof, having an internal substantially cylindrical space with an open rearward end for receiving other components of the assembly, said housing member having threading over at least a portion of its external surface;
- an aperture piece adapted to fit within said housing;
- a circuit board having sensor circuitry and having at least one optoelectronic element mounted thereon, and having a cable for external connection for the sensor, said circuit board adapted for mounting adjacent the rearward end of said aperture piece in assembly to define an optical sensing path from said optoelectronic element through an opening of said aperture piece through said lens to an external sensing path extending from the front of the sensor;
- a first annular resilient member positioned adjacent the back of said circuit board for urging it in contact with said aperture piece;
- a first washer positioned within said housing member in contact with said first resilient member;
- an abutment member formed within said housing member for receiving said first washer as it presses against said first resilient member;
- a second resilient member, serving as a sealing member, for positioning within said housing substantially in contact with the interior wall of said housing and in contact with said first washer, said cable passing through an aperture in said sealing member;
- a second washer positioned in said housing in contact with the rear end of said sealing member; and
- an end cap having threads for engaging the threaded exterior portion of said molded housing member, including means for pressing onto said second washer when said end cap is threaded onto said housing, so that said second resilient member is compressed and forced into sealing contact with the interior surface of the housing and with said cable, to thereby provide a moistureproof seal for the interior of the sensor assembly.

14. An assembly according to claim 13 wherein said circuit board has optoelectronic transmitting and receiving elements mounted thereon, wherein said aperture piece has openings aligned with both of said optoelectronic elements, and an opaque baffle therebetween to prevent unwanted scattering of light from the transmitting element to the receiving element, and wherein said focus lens of said housing member is adapted to focus external sensing paths from the front of the sensor to both the transmitting and receiving optoelectronic elements.

15. An assembly according to claim 12 wherein said end cap has a spherical external section, and further including mounting means for adjustably positioning said sensor in use, said mounting means including a socket portion having a curved surface for receiving said end cap, thereby to hold said sensor in position while permitting two degree motion thereof for alignment purposes, said mounting means further including means for securing said sensor in place after alignment.

* * * * *